United States Patent

Takami

[11] Patent Number: 6,166,101
[45] Date of Patent: Dec. 26, 2000

[54] ULTRAVIOLET-CURING COATING COMPOSITION FOR CANS

[75] Inventor: Seiji Takami, Chigasaki, Japan

[73] Assignee: Kansai Paint Co., Ltd., Hyogo-ken, Japan

[21] Appl. No.: 09/197,415

[22] Filed: Nov. 23, 1998

[30] Foreign Application Priority Data

Nov. 21, 1997 [JP] Japan ..................... 9-320665

[51] Int. Cl.$^7$ .................. C08F 2/46; C08F 2/50
[52] U.S. Cl. ............. 522/168; 522/170; 522/100; 522/181; 427/508; 427/517; 428/413
[58] Field of Search ............ 522/168, 170, 522/180, 181; 427/517, 508; 428/413

[56] References Cited

U.S. PATENT DOCUMENTS

| | | | |
|---|---|---|---|
| 3,835,003 | 9/1974 | Schlesinger | 522/32 |
| 4,154,872 | 5/1979 | Tsao et al. | 427/496 |
| 5,093,386 | 3/1992 | Bishop et al. | 522/96 |
| 5,370,971 | 12/1994 | Ogawa et al. | 430/280.1 |
| 5,463,084 | 10/1995 | Crivello et al. | 549/96 |
| 5,658,964 | 8/1997 | Amon et al. | 522/31 |
| 5,674,922 | 10/1997 | Igarashi et al. | 522/168 |
| 5,721,020 | 2/1998 | Takami et al. | 427/508 |
| 5,882,842 | 3/1999 | Akaki et al. | 430/280.1 |

*Primary Examiner*—Samuel A. Acquah
*Assistant Examiner*—Sanza L. McClendon
*Attorney, Agent, or Firm*—Wenderoth, Lind & Ponack, L.L.P.

[57] ABSTRACT

There is disclosed an ultraviolet-curing coating composition for cans comprising (A) 10–85 parts by weight of a compound having alicyclic epoxy group(s) in the molecule, (B) 5–60 parts by weight of a compound having an oxetane ring of a specific structure, (C) 5–60 parts by weight of a compound having an oxetane ring and hydroxyl group in the molecule, (D) 5–60 parts by weight of a compound having either at least two oxetane rings or oxetane ring(s) and epoxy group(s) in the molecule, and (E) 0.01–20 parts by weight of a cation-polymerization initiator, which generates a cation when irradiated with ultraviolet rays, per 100 parts by weight of the total amount of the compounds (A), (B), (C) and (D); and a process for producing a coated metal can by coating this coating composition and curing by irradiation with ultraviolet rays.

This ultraviolet-curing coating composition can form a coating film which is excellent in processability, adhesivity, hardness, hardness in hot water, and coating film appearance such as levelling property.

21 Claims, No Drawings

ULTRAVIOLET-CURING COATING COMPOSITION FOR CANS

BACKGROUND OF THE INVENTION

1. Field of the Invention

The present invention relates to an ultraviolet-curing coating composition for cans, capable of forming a coating film which can be cured by irradiation with ultraviolet rays and which, when cured, is superior in coating film properties such as processability, adhesivity, hardness, hardness in hot water, etc., and superior in coating film appearance such as levelling property etc. and a process for producing a coated metal can by using the composition.

2. Description of the Related Art

Up to the present, as ultraviolet-curing coating composition, there are known cation-polymerizable coatings comprising a cation-polymerizable compound having an epoxy group(s) and a vinyl group(s) and a cation-polymerization initiator which generates a cation when irradiated with ultraviolet rays, radical-polymerizable coatings comprising a radical-polymerizable compound having a radical-polymerizable unsaturated groups and a radical-polymerization initiator which generates a radical when irradiated with ultraviolet rays, etc. However, the radical-polymerizable coatings, although having a feature of a relatively high curing rate, have problems in that they are insufficient in intimate adhesion to substrate and processability, are inferior in surface curing because the curing is inhibited by oxygen and particularly, when used for thin (2–8μ) film application, require an apparatus for nitrogen sealing or the like. Meanwhile, the cation-polymerizable coatings, although when compared with the radical-polymerizable coatings, having good adhesivity to substrate and good processability and requiring no apparatus for nitrogen sealing or the like, have problems in that they have a low curing rate and consequently are insufficient in film properties, particularly film appearance and retort resistance of film.

Moreover, any polymerization system has a problem in that the curability is insufficient when irradiated with ultraviolet rays at a low exposure.

Hence, the present inventors have made an intensive study with an aim of obtaining an ultraviolet-curing coating composition, capable of forming a coating film which can be cured by irradiation with ultraviolet rays at a low exposure, even in a thin film state, without requiring any facility for nitrogen sealing or the like and which, when cured, is superior in film properties necessary for a coating for cans such as processability, adhesivity, hardness etc., superior in film appearance such as levelling property etc., and also capable of forming a coating film which shows an excellent hardness in hot water, after heating after irradiation with ultraviolet rays. As a result, the present inventors have found out that the above-mentioned aim can be achieved by using a coating composition in which an alicyclic epoxy compound, a compound having an oxetane ring and a cation-polymerization initiator are compounded in specific amounts and completed the present invention.

SUMMARY OF THE INVENTION

Thus, the present invention provides an ultraviolet-curing coating composition for cans comprising (A) 10–85 parts by weight of a compound having alicyclic epoxy group(s) in the molecule, (B) 5–60 parts by weight of a compound having an oxetane ring represented by the following formula (1)

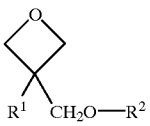

(1)

wherein $R^1$ represents a hydrogen atom, a fluorine atom, a straight chain, branched chain or cyclic alkyl group of 1–6 carbon atoms, a straight chain, branched chain or cyclic fluoroalkyl group of 1–6 carbon atoms, an allyl group, an aryl group, an aralkyl group, a furyl group or a thienyl group; and $R^2$ represents an alkyl or alkenyl group of 2–12 carbon atoms, an aryl group, an aralkyl group, or an ether group represented by the following formula (2)

(2)

wherein $R^3$ represents an ethylene group, $R^4$ represents a propylene group, $R^5$ represents a butylene group, $R^6$ represents an alkyl group of 1–12 carbon atoms, k is an integer of 0–6, m is an integer of 0–6, n is an integer of 0–6, and the sum of k, m and n is an integer of 1–6, (C) 5–60 parts by weight of a compound having an oxetane ring and hydroxyl group in the molecule, (D) 5–60 parts by weight of a compound having either at least two oxetane rings or oxetane ring(s) and epoxy group(s) in the molecule, and (E) 0.01–20 parts by weight of a cation-polymerization initiator, which generates a cation when irradiated with ultraviolet rays, per 100 parts by weight of the total amount of the compounds (A), (B), (C) and (D).

In the above description, the amounts of the compounds (A), (B), (C) and (D) are the amounts in 100 parts by weight of the total of these 4 components.

The present invention further provides a process for producing a coated metal can characterized by coating the above-mentioned ultraviolet-curing coating composition for cans on a metal plate, a resin film-laminated metal plate or a metal can obtained by molding these metal plates followed by curing by irradiation with ultraviolet rays.

DETAILED DESCRIPTION OF THE INVENTION

The composition of the present invention is a coating composition which, when irradiated with ultraviolet rays, gives rise to cationic polymerization and subsequent curing. Each component of the composition is described hereinafter in more detail.

Compound Having Alicyclic Epoxy Group(s) in the Molecule (A)

As a compound having alicyclic epoxy group(s) in the molecule (A) [hereinafter may be referred to as "Epoxy compound (A)"], any compound having more than one, preferably 1–2 alicyclic epoxy groups in the molecule can be used without special restriction, and there can be mentioned, as specific examples, dicyclopentadiene dioxide, limonene dioxide, di(3,4-epoxycyclohexyl) adipate, (3,4-epoxy-6-methylcyclohexyl)methyl 3,4-epoxy-6-methylcyclohexanecarboxylate, ethylene-1,2-di(3,4-epoxycyclohexanecarboxylic acid)ester, the compounds represented by the following formulae (3)–(5). These compounds can be used alone or in combination of two or more compounds.

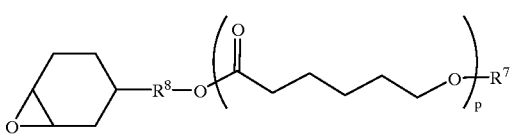
(3)

wherein R[7] represents a hydrogen atom, an alkyl group of 1–8 carbon atoms which may have an epoxy group(s), or an acyl group of 1–12 carbon atoms which may have an epoxy group(s); R[8] represents an alkylene group of 1–6 carbon atoms; and p represents an integer of 0–15,

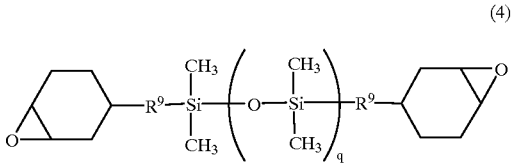
(4)

wherein two R[9]s may be the same or different and each represents an alkylene group of 1–6 carbon atoms; and q represents an integer of 0–25,

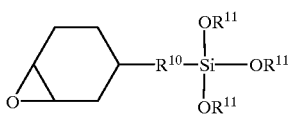
(5)

wherein R represents an alkylene group of 1–6 carbon atoms and three R[11]s may be the same or different and each represents an alkyl group of 1–4 carbon atoms.

In the above-mentioned formula (3) the alkyl group, which R[7] can represent, is straight chain, branched chain or cyclic and includes, for example, methyl, ethyl, n- or i-propyl, n-, i- or t-butyl, octyl, cyclohexyl groups. The alkyl group having an epoxy group(s), which R[7] can represent, includes, for example, 3,4-epoxycyclohexylmethyl group. The acyl group, which R[7] can represent, is a group of the formula RCO (wherein R is a hydrogen atom or an organic group such as alkyl, alkenyl, cycloalkyl, aryl, aralkyl etc.) and includes, for example, formyl, acetyl, propionyl, butyroyl, octanyl, lauroyl, acryloyl, methacryloyl, benzoyl groups etc. The acyl group having an epoxy group(s), which R[7] can represent, includes, for example, 3,4-epoxycyclohexanecarbonyl group etc. The alkylene group, which R[8] can represent, is straight chain, branched chain or cyclic and includes, for example, methylene, ethylene, 1,2- or 1,3-propylene, butylene and cyclohexylene groups etc.

Typical examples of the compound represented by the above-mentioned formula (3) wherein p is 0, include 3,4-epoxycyclohexylmethyl 3,4-epoxycyclohexanecarboxylate, 3,4-epoxycyclohexylmethyl acrylate, 3,4-epoxycyclohexylmethyl methacrylate, 3,4-epoxycyclohexylmethyl alcohol, di(3,4-epoxycyclohexylmethyl)ether. Typical examples of the compound represented by the formula (3) wherein p is an integer of 1–15, preferably 1–6, include those compounds in which R[7] is a hydrogen atom and R[8] is a methylene group; R[7] is a 3,4-epoxycyclohexanecarbonyl group and R[8] is a methylene group; R[7] is an acryloyl group and R[8] is a methylene group; and R[7] is a methacryloyl group and R[8] is a methylene group in case where p is any integer of 1–15.

In the aforementioned formula (4), the alkylene group, which R[9] represents, is straight chain, branched chain or cyclic and includes, for example, methylene, ethylene, 1,2- or 1,3-propylene, butylene and cyclohexylene groups. Typical examples of the compound represented by the above-mentioned formula (4) include those compounds in which two R[9]s are both 1,2-ethylene groups and q is an integer of 0–25.

In the aforementioned formula (5) the alkylene group, which R[10] represents, is straight chain, branched chain or cyclic and includes, for example, methylene, ethylene, 1,2- or 1,3-propylene, butylene and cyclohexylene groups. Typical examples of the compound represented by the above-mentioned formula (5) include those compounds in which R[10] is ethylene and three R[11]s are all methyl groups; R[10] is 1,2- or 1,3-propylene group and three R[11]s are all methyl groups.

Of the above-mentioned compounds (A) having alicyclic epoxy group(s) in the molecule, particularly preferable compounds include 3,4-epoxycyclohexylmethyl 3,4-epoxycyclohexanecarboxylate, 3,4-epoxycyclohexylmethyl alcohol, 3,4-epoxycyclohexylethyltrimethoxysilane and the compounds represented by the following formulae:

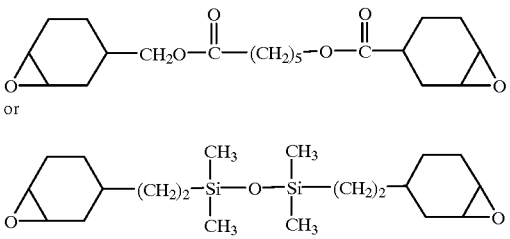

or

Compound Having an Oxetane Ring Represented by the Formula (1) (B)

The compound having an oxetane ring (B) used in the coating composition of the present invention is a compound having an oxetane ring

in the molecule represented by the following formula (1):

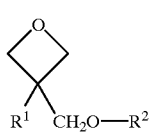
(1)

wherein R[1] represents a hydrogen atom, a fluorine atom, a straight chain, branched chain or cyclic alkyl group of 1–6 carbon atoms, a straight chain, branched chain or cyclic fluoroalkyl group of 1–6 carbon atoms, an allyl group, an aryl group, an aralkyl group, a furyl group or a thienyl group; and R[2] represents an alkyl or alkenyl group of 2–12 carbon atoms, an aryl group, an aralkyl group, or an ether group represented by the following formula (2)

(2)

wherein R[3] represents an ethylene group, R[4] represents a propylene group, R[5] represents a butylene group, R[6]

represents an alkyl group of 1–12 carbon atoms, k is an integer of 0–6, m is an integer of 0–6, n is an integer of 0–6, and the sum of k, m and n is an integer of 1–6.

In the above-mentioned formula (1), $R^1$ represents a hydrogen atom, a fluorine atom, a straight chain, branched chain or cyclic alkyl group of 1–6 carbon atoms (for example, methyl, ethyl, n- or i-propyl, n-, i- or t- butyl, pentyl, hexyl or cyclohexyl group), a straight chain or branched chain fluoroalkyl group of 1–6 carbon atoms (for example, monofluoromethyl, difluoromethyl, trifluoromethyl, 2,2,2-trifluoroethyl, perfluoroethyl, perfluoropropyl, perfluorobutyl or perfluorohexyl), an allyl group, an aryl group (for example, phenyl, naphthyl, tolyl, xylyl group), an aralkyl group (for example, benzyl, phenethyl group etc.) and the like; and $R^2$ represents an alkyl group of 2–12 carbon atoms (for example, ethyl, n- or i-propyl, n-, i- or t- butyl, pentyl, hexyl, octyl, decyl dodecyl or cyclohexyl group), an alkenyl group of 2–12 carbon atoms (for example, ally group), an aryl group (for example, phenyl, naphthyl, tolyl, xylyl group) or an aralkyl group (for example, benzyl, phenethyl group), or a group represented by the above-mentioned formula (2).

The group represented by the above-mentioned formula (2) is a group having ethyleneoxy, propyleneoxy, or butyleneoxy group and the end thereof is blocked by an alkyl group of 1–12 carbon atoms $R^6$.

As an alkyl group of 1–12 carbon atoms represented by $R^6$ there can be mentioned methyl, ethyl, n- or i-propyl, n-, i- or t- butyl, pentyl, hexyl, octyl, decyl dodecyl, cyclohexyl groups etc.

As $R^1$ ethyl group is preferable above all and as $R^2$ butyl, hexyl, phenyl groups etc. are preferable above all.

Compound Having an Oxetane Ring and Hydroxyl Group in the Molecule (C)

The compound (C) used in the coating composition of the present invention is any compound having an oxetane ring, which can give rise to ring-opening polymerization when irradiated with ultraviolet rays in the presence of a cation-polymerization initiator, and at least one, preferably one, hydroxyl group in the molecule without special restriction and includes, as specific examples, the compounds represented by the following formula (6):

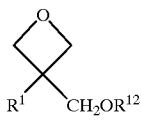

(6)

In the above-mentioned formula (6), R has the same meaning as in the aforementioned formula (1) and $R^{12}$ represents a hydrogen atom or an organic group having a hydroxyl group.

As the above-mentioned $R^1$, ethyl group is preferable above all.

As an organic group having a hydroxyl group, which $R^{12}$ can represent, there can be mentioned a straight chain, branched chain or cyclic monovalent hydrocarbon group of 1–30 carbon atoms, which has a hydroxyl group and, besides hydroxyl group, may have at least one hetero atom selected from O, S, N and F, and/or a siloxane bond(s).

More specifically, as the organic group having a hydroxyl group, which $R^{12}$ can represent, there can be mentioned 2-hydroxyethyl, 2-hydroxypropyl, 2-hydroxy-3-phenoxypropyl, 2-hydroxy-3-butoxypropyl groups or the group represented by the following formula:

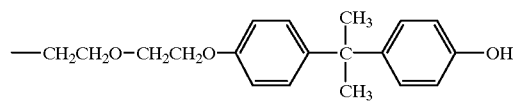

As $R^{12}$ a hydrogen atom is preferable above all.

Specific examples of the compound (C) include 3-methyl-3-hydroxymethyloxetane, 3-ethyl-3-hydroxymethyloxetane, 3-ethyl-3-(2'-hydroxyethyl)oxymethyloxetane, 3-ethyl-3-(2'-hydroxy-3'-phenoxypropyl)oxymethyloxetane, 3-ethyl-3-(2'-hydroxy-3'-butoxypropyl)oxymethyloxetane. Of these, 3-ethyl-3-hydroxymethyloxetane is particularly preferable.

Compound Having at Least Two Oxetane Rings or Oxetane Rings) and Epoxy Group(s) in the Molecule (D)

As a compound having two or more oxetane rings in the molecule, which can be a component (D) in the coating composition of the present invention [hereinafter referred to as polyoxetane compound] any compound having two or more oxetane rings in the molecule may be used without special restriction. As a specific example, compounds represented by the following formula can be mentioned:

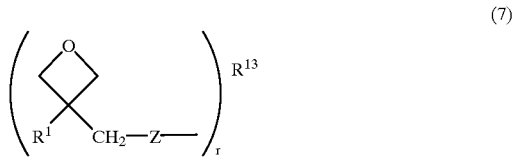

(7)

In the above-mentioned formula (7) $R^1$ has the same meaning as in the afore-mentioned formula (1), $R^{13}$ represents an organic group having a valency of 2–4, which corresponds to the value of r, Z represents an oxygen atom or a sulphur atom, and r is an integer of 2–4.

As a 2–4 valent organic group, which $R^{13}$ can represent, there can be mentioned a straight chain, branched chain or cyclic 2–4 valent hydrocarbon group of 1–30 carbon atoms, which may contain at least one hetero atom selected from O, S, N and F, and/or a siloxane bond(s).

Specific examples of the divalent organic group, which $R^{13}$ can represent, there can be mentioned, for example, a straight chain, branched chain or cyclic alkylene group (particularly an alkylene group of 1–15 carbon atoms such as methylene, ethylene, 1,2- or 1,3-propylene, butylene, cyclohexylene), a poly(alkyleneoxy) group of 4–30, preferably 4–8 carbon atoms (for example, poly(ethyleneoxy) or poly(propyleneoxy) group), a phenylene group, a xylylene group, a group represented by the following formulae (8) and (9):

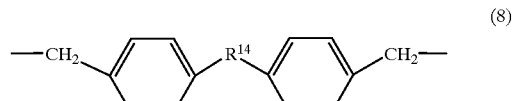

(8)

wherein $R^{14}$ represents O, S, $CH_2$, NH, SO, $SO_2$, $C(CF_3)_2$ or $C(CH_3)_2$,

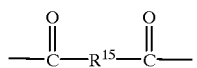
(9)

wherein $R^{15}$ represents an alkylene group of 1–6 carbon atoms, an arylene group or a direct bond, and a group of 2–30, preferably 2–6 carbon atoms wherein two alkylene groups are bonded via a (poly)siloxane chain (for example, said alkylene group is ethylene or propylene groups and the molecular weight of the (poly)siloxane chain is 130–15,000, particularly 130–500; preferably a group represented by the following formula (10):

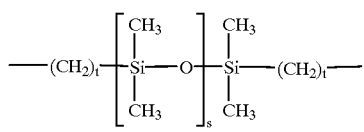
(10)

wherein s represents an integer of 1–6, and t is 2 or 3.

Further specific examples of the tri or tetravalent group, which $R^{13}$ can represent, there can be mentioned, for example, groups represented by the following formulae (11)–(14):

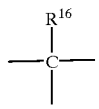
(11)

where $R^{16}$ represents an alkyl group of 1–6 carbon atoms, for example an ethyl group,

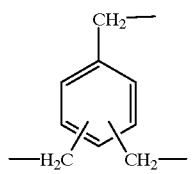
(12)

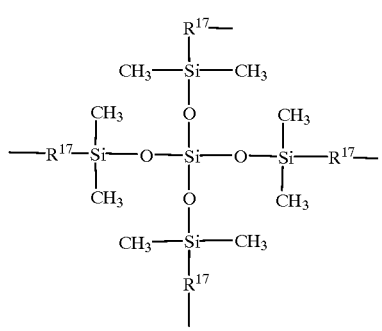
(13)

wherein four $R^{17}$ may be the same or different and each represents an alkylene group of 1–6 carbon atoms, for example, an ethylene group),

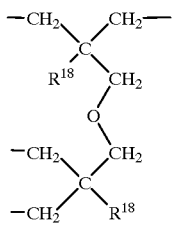
(14)

wherein two $R^{18}$ may be the same or different and each represents a hydrogen atom, a fluorine atom, an alkyl group of 1–6 carbon atoms, a fluoroalkyl group of 1–6 carbon atoms, an allyl group, an aryl group, a furyl group or a thienyl group.

In the aforementioned formula (7), of the 2–4 valent organic groups, which $R^{13}$ can represent, divalent groups are preferable (i.e. preferable r is 2) and particularly preferable groups are alkylene groups of 1–6 carbon atoms such as methylene, ethylene, propylene, butylene and hexylene groups; p-xylylene group; and the group represented by the following formula:

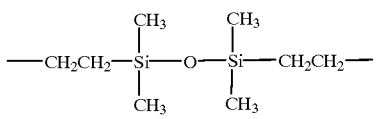

In the aforementioned formula (7), preferable Z is 0, and preferable $R^1$ is a hydrogen atom, a methyl group or an ethyl group.

As specific examples of the compounds represented by the aforementioned formula (7) there can be mentioned compounds of the formula (7) wherein Z is 0, $R^1$ is an ethyl group, and $R^{13}$ is 1,4-tetramethylene group, dodecamethylene group, o-, m- or p-xylylene group, or a group of the aforementioned formula (9), where $R^{15}$ is an ethylene group, or a group of the above-mentioned formula (10).

As polyoxetane compounds, besides the compounds represented by the aforementioned formula (7), there can be mentioned the compounds represented by the following formulae (15), (16) or (17):

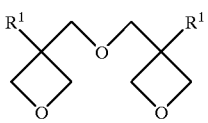
(15)

wherein two $R^1$s may be the same or different and each has the same meaning as mentioned before and particularly an ethyl group is preferable.

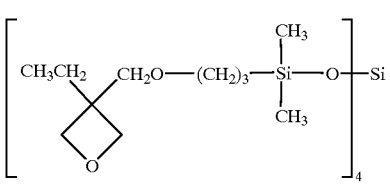
(16)

-continued (17)

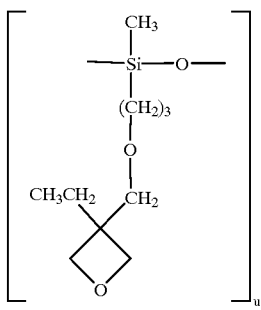

wherein u represents an integer of 25–200.

Furthermore, a compound having an oxetane ring and an epoxy group in the molecule, which can be a component (D) in the coating composition of the present invention (hereinafter referred to as epoxy-containing oxetane compound) includes a compound having each one oxetane ring and one epoxy group in the molecule and having a preferable molecular weight of less than 1,000. Specifically, for example, there can be mentioned a compound represented by the following formula (18):

(18)

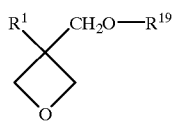

wherein $R^1$ has the same meaning as mentioned before, and $R^{19}$ represents an epoxy-containing group.

Typical examples of the epoxy-containing oxetane compound include those compounds of the above-mentioned formula (18) wherein $R^1$ is an ethyl group and $R^{19}$ is a glycidyl group or a 3,4-epoxycyclohexylmethyl group.

Of the above-mentioned compounds, as particularly preferable compounds as the component (D), there can be mentioned 3-ethyl-3-glycidyloxymethyloxetane and 1,4-bis [(3-ethyl-3-oxetanylmethoxy)methyl]benzene represented by the following formula:

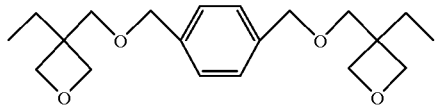

Cation-Polymerization Initiator (E)

The cation-polymerization initiator (E) used in the present invention is a compound which generates a cation when irradiated with ultraviolet rays, to initiate polymerization, and includes, for example, hexafluoroantimonate salt, pentafluorohydroxyantimonate salt, hexafluorophosphate salt, hexafluoroarsenate salt, tetrakis(pentafluorophenyl)borate salt and other cation-polymerization initiators, each represented by one of the following formulae (I) to (XV):

$$Ar_2I^+ \cdot X^- \qquad (I)$$

wherein Ar represents an aryl group, for example, a phenyl group; and $X^-$ represents $PF_6^-$, $SbF_6^-$, $AsF_6^-$ or $B(C_6F_5)_4^-$ represented by the following formula:

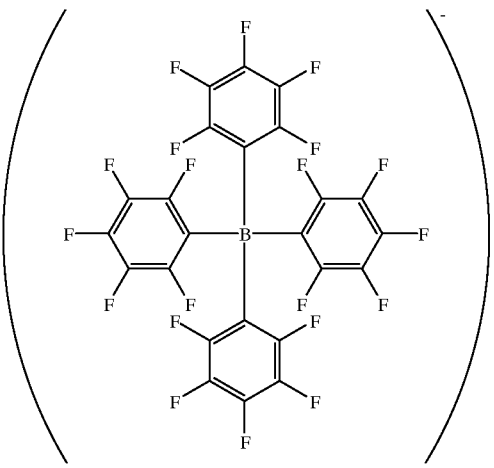

$$Ar_3S^+ \cdot X^- \qquad (II)$$

wherein Ar and $X^-$ each has the same meaning as mentioned above, (III)

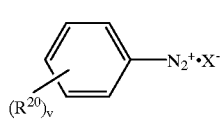

wherein $R^{20}$ represents an alkyl group of 1–12 carbon atoms or an alkoxy group of 1–12 carbon atoms; v represents an integer of 0–3; and $X^-$ has the same meaning as mentioned above, (IV)

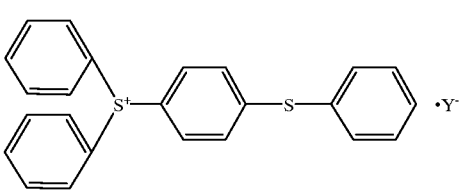

wherein $Y^-$ represents $PF_6^-$, $SbF_6^-$, $AsF_6^-$ or $SbF_5(OH)^-$, (V)

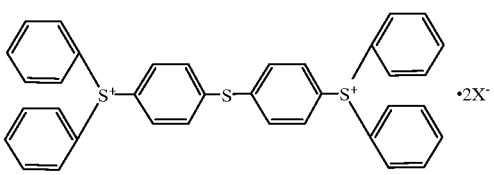

wherein $X^-$ has the same meaning as in the aforementioned formula (I),

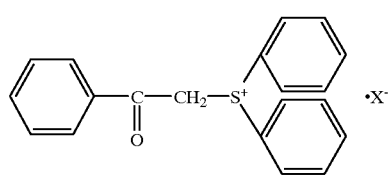
(VI)

wherein X⁻ has the same meaning as in the aforementioned formula (I),

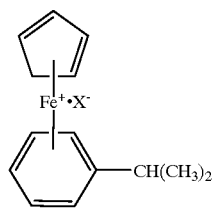
(VII)

wherein X⁻ has the same meaning as in the afore-mentioned formula (I),

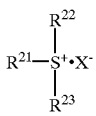
(VIII)

wherein $R^{21}$ represents an aralkyl group of 7–15 carbon atoms or an alkenyl group of 3–9 carbon atoms; $R^{22}$ represents a hydrocarbon group of 1–7 carbon atoms or a hydroxyphenyl group; $R^{23}$ represents an alkyl group of 1–5 carbon atoms which may contain an oxygen atom(s) or a sulphur atom(s); and X⁻ has the same meaning as in the afore-mentioned formula (1),

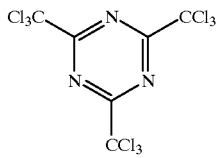
(IX)

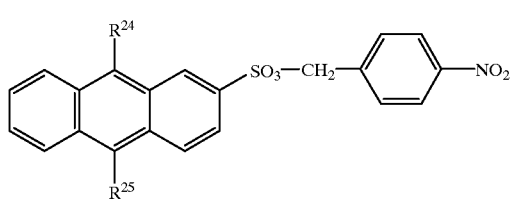
(X)

wherein $R^{24}$ and $R^{25}$ each independently represents an alkyl group of 1–12 carbon atoms or an alkoxy group of 1–12 carbon atoms,

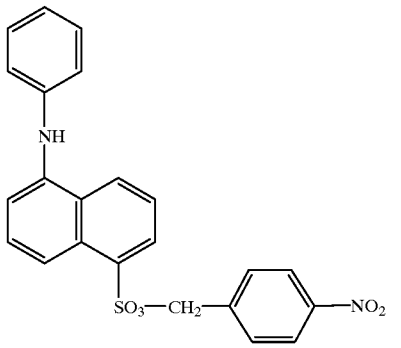
(XI)

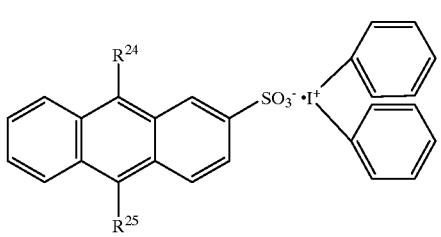
(XII)

wherein $R^{24}$ and $R^{25}$ each has the same meaning as mentioned above,

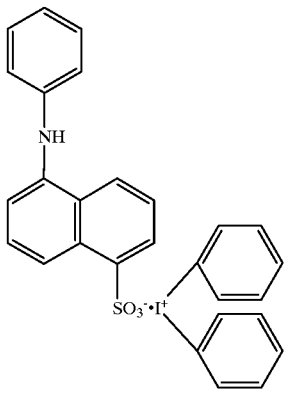
(XIII)

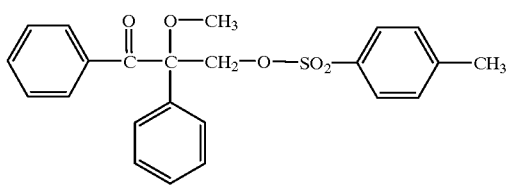
(XIV)

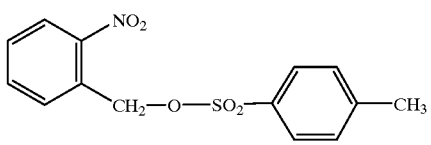
(XV)

As the cation-polymerization initiator (E) a commercial product may be used. Commercial products include, for example, Cyracure UVI-6970, Cyracure UVI-6974 and Cyracure UVI-6990 (these are products of Union Carbide Corporation of U.S.), Irgacure 264 (a product of Ciba Geigy Co.) and CIT-1682 (a product of Nippon Soda Co., Ltd.).

Of the above-mentioned cation-polymerization initiators, compounds having hexafluorophosphate anion ($PF_6^-$) are preferable in view of the toxicity, general-purpose applicability etc.

In the coating composition of the present invention, the compounding ratio of the epoxy compound (A), the compound having an oxetane ring (B), the oxetane compound having a hydroxyl group (C) and the polyoxetane compound or epoxy-containing oxetane compound (D) is 10–85/5–60/5–60/5–60, preferably 20–70/10–40/10–40/10–40 and more preferably 40–70/10–20/10–20/10–20, indicated as parts by weight of solid content of (A)/(B)/(C)/(D) in 100 parts by weight of the total of (A), (B), (C) and (D).

In the coating composition of the present invention, the compounding amount of the cation-polymerization initiator (E) is 0.01–20 parts by weight, preferably 0.1–10, and more preferably 1–10 parts by weight per 100 parts by weight of the total amount of the components (A), (B), (C) and (D).

The coating composition of the present invention may further comprise as necessary, besides the essential components (A), (B), (C), (D) and (E), a lubricity-imparting agent; a sensitizer; a pigment or a dye such as coloring pigment, filler etc. of such an amount that curing is not significantly hindered, a modifying resin such as polyol resin, phenolic resin, acrylic resin, polyester resin, polyolefin resin, epoxy resin, epoxidized polybutadiene resin; organic resin fine particles; a solvent; and so forth.

The above-mentioned lubricity-imparting agent is compounded to improve the lubricity of the coating film to be obtained and there can be mentioned, for example, a wax such as fatty acid ester wax which is an esterified product of a polyol compound and a fatty acid, silicone oil wax, fluorine-based wax, polyolefin wax, animal wax and vegetable wax.

The polyol compounds to be used as raw materials for the above-mentioned fatty acid ester wax include ethylene glycol, diethylene glycol, triethylene glycol, tetraethylene glycol, 1,3- or 1,4-butanediol, neopentyl glycol, 1,6-hexanediol, glycerol, di- or higher polyglycerol, trimethylolpropane, pentaerythritol, dipentaerythritol etc. Of these, polyol compounds having three or more hydroxyl groups in the molecule are preferable. Above all, glycerol, trimethylolpropane and pentaerythritol are preferable.

The fatty acids to be used as the other raw materials for the above-mentioned fatty acid ester wax include saturated or unsaturated fatty acids and preferably fatty acids of 6–32 carbon atoms. Specific examples of preferable fatty acids include saturated fatty acids such as caprylic acid, pelargonic acid, capric acid, lauric acid, myristic acid, palmitic acid, stearic acid, arachic acid, behenic acid, cerotic acid, montanic acid, melissic acid; unsaturated fatty acids such as caproleic acid, undecylenic acid, palitoleic acid, oleic acid, linolic acid, linolenic acid, eleostearic acid, cetoleic acid, erucic acid, licanic acid, ricinoleic acid, arachidonic acid, acid.

Fatty acid ester wax, in which at least ⅓ of the total number of hydroxyl groups of the above-mentioned polyol compound are esterified with a fatty acid, is preferable.

Silicone oil wax includes, for example, BYK-300, BYK-320, BYK-330 (these are products of BYK Chemie); Silwet L-77, Silwet L-720 and Silwet L-7602 (these are products of Nippon Unicar Co., Ltd.); Paint-Add 29, Paint-Add 32 and Paint-Add (These are products of Dow Cornig Corporation); and Shin-etsu Silicone KF-96 (a product of Shin-etsu Chemical Co., Ltd.). Fluorine-based wax includes, for example, Shamrock Wax SST-1MG, Shamrock Wax SST-3, Shamrock Wax Fluoroslip 231 (these are products of Shamrock Chemicals Co.); and POLYFLUO 120, POLYFLUO 150, POLYFLUO 400 (these are products of Micro Powders Co.)

Polyolefin wax includes, for example, Shamrock Wax S-394 and Shamrock Wax S-395 (these are products of Shamrock Chemicals Co.); Hoechst Wax PE-520 and Hoechst Wax PE-521 (these are products of Hoechst Co.); and Mitsui High Wax (a product of Mitsui Petrochemical Industries, Ltd.). Animal wax includes, for example, lanolin and bees wax. Vegetable wax includes, for example, carnauba wax and Japan wax.

The lubricity-imparting agent as mentioned above can be used alone or in cobination of two or more. The compounding amount of the lubricity-imparting agent is in a range of usually 0.01–10 parts by weight, preferably 0.1–5 parts by weight, and more preferably 0.5–3 parts by weight per 100 parts by weight of the total amount of the components (A), (B), (C) and (D).

Among the above-mentioned lubricity-imparting agents, the silicone oil wax can impart excellent lubricity after film curing but before retort treatment and the fatty acid ester wax can impart excellent lubricity after film curing and retort treatment. Therefore, it is preferable to compound at least one wax selected from the silicone oil wax and the fatty acid ester wax. Above all, a combined use of 0.01–5 parts by weight of the silicone oil wax and 0.1–5 parts by weight of the fatty acid ester wax per 100 parts by weight of the total amount of the components (A), (B), (C) and (D) can provide a coating film having excellent lubricity before and after retort treatment.

The afore-mentioned sensitizer is compounded to further improve the curability by ultraviolet rays and includes, for example, pyrene, perylene, Acridine Orange, thioxanthone, 2-chlorothioxanthone and benzoflavin. The sensitizer is used in an amount of usually less than 10 parts by weight, preferably less than 3 parts by weight per 100 parts by weight of the total amount of the components (A), (B), (C) and (D).

When a modifying resin is compounded, it is preferable to use said modifying resin in a range of usually 0.1–50 parts by weight, particularly 3–30 parts by weight, and more particularly 5–20 parts by weight per 100 parts by weight of the total amount of the components (A), (B), (C) and (D). As the modifying resin, an epoxydized polybutadiene resin is particularly effective for the improvement of film processability, adhesivity etc.

Use of a copolymer having at least one glycidyl group in the molecule and having a glass transition temperature of higher than 30° C., preferably 50–135° C., and more preferably 60–135° C., improves the hardness in hot water of the coating film to be obtained.

The above-mentioned copolymer can be obtained by copolymerizing a glycidyl group-containing polymerizable unsaturated monomer (hereinafter may be referred to as glycidyl monomer) and, as necessary, another polymerizable unsaturated monomer, which is copolymerizable with said monomer, (hereinafter may be referred to as other monomer).

As the above-mentioned glycidyl monomer, any polymerizable unsaturated monomer containing a glycidyl group may be used without special restriction. Typical examples thereof include glycidyl acrylate, glycidyl methacrylate, methylglycidyl acrylate, methylglycidyl methacrylate, allyl glycidyl ether and vinyl glycidyl ether. Of these, glycidyl acrylate and glycidyl methacrylate are used preferably.

Other monomer, which is copolymerizable with the above-mentioned glycidyl monomer, is a monomer used as necessary according to the targeted properties of the copolymer to be obtained, and includes, for example, alkyl or cycloalkyl esters of acrylic acid or methacrylic acid of 1–24 carbon atoms such as methyl acrylate, methyl methacrylate, ethyl acrylate, ethyl methacrylate, n-, i- or t-butyl acrylate, n-, i- or t-butyl methacrylate, hexyl acrylate, hexyl methacrylate, octyl acrylate, octyl methacrylate, lauryl acrylate, lauryl methacrylate, stearyl acrylate, stearyl methacrylate, cyclohexyl acrylate and cyclohexyl methacrylate; hydroxyalkyl esters of acrylic acid or methacrylic acid of 1–8 carbon atoms such as 2-hydroxyethyl acrylate, 2-hydroxyethyl methacrylate, 2-hydroxypropyl acrylate, 2-hydroxypropyl methacrylate, 4-hydroxybutyl acrylate and 4-hydroxybutyl methacrylate; $\alpha,\beta$-ethylenic unsaturated carboxylic acids such as acrylic acid, methacrylic acid, maleic acid, itaconic acid and crotonic acid; acrylamide or methacrylamide or their derivatives such as acrylamide, methacrylamide, N-methylacrylamide, N-ethylmethacrylamide, diacetoneacrylamide, N-methylolacrylamide, N-methylolmethacrylamide, N-methoxymethylacrylamide, N-butoxymethylacrylamide; aromatic vinyl monomers such as styrene, vinyltoluene and $\alpha$-methylstyrene; and other vinyl monomers such as vinyl propionate, vinyl acetate, acrylonitrile, methacrylonitrile, vinyl pivalate, Veova Monomer (a product of Shell Chemicals Co., Ltd.: a vinyl ester of branched fatty acid), Silaplane FM 0711, Silaplane FM 0721, Silaplane FM 0725 (these are products of Chisso Corporation: polydimethylsiloxane macromonomers having methacryloyl groups at the end). Among these monomers, styrene and methyl methacrylate are particularly preferable.

The above-mentioned copolymer can be obtained by polymerizing the monomer components, consisting of the above-mentioned glycidyl monomer and another monomer as necessary, according to a per se known polymerization process such as solution polymerization, block polymerization, emulsion polymerization, suspension polymerization etc. in the presence or absence of, for example, a radical polymerization initiator. The above-mentioned copolymer has a preferable number-average molecular weight in a range of generally 1,000–100,000, particularly 2,000–50,000.

The compounding ratio of each monomer component is preferably in the following range per 100 parts by weight of the total amount of the monomer components:

Glycidyl monomer: 10–100 parts by weight, preferably 20–80 parts by weight,

Other monomer: 0–90 parts by weight, preferably 20–80 parts by weight.

The concentration of the glycidyl group in the above-mentioned copolymer is preferably in a range of generally 0.1–7.0 equivalents/kg, particularly 0.2–5.0 equivalents/kg.

Use of a polydimethylsiloxane macromonomer such as Silaplane FM 0721 as another monomer in the polymerization for the above-mentioned copolymer can improve the levelling property of the film to be obtained and the sliding property of the film after retort treatment.

The above-mentioned copolymer containing glycidyl groups can be used in a range of usually 1–50 parts by weight, preferably 2–30 parts by weight, and more preferably 4–25 parts by weight per 100 parts by weight of the total amount of the components (A), (B), (C) and (D).

As the afore-mentioned organic resin fine particles, organic resin fine particles having a preferable particle diameter in a range of 50–500 nm and there can be mentioned, for example, acrylic resin fine particles which are internally crosslinked three-dimensionally. The organic resin fine particles include, for example, those obtained by grinding an organic polymer into fine particles; or by conducting emulsion polymerization in water in the presence of an emulsifier and drying and grinding the resulting polymer fine particles; or by conducting dispersion polymerization in an organic solvent in the presence of a polymer stabilizer and drying and grinding the resulting polymer fine particles. Compounding of the organic resin fine particles in the coating composition of the present invention can provide a coating film of improved adhesivity and processability. When the organic resin fine particles are compounded, the preferable compounding amount of said organic resin fine particles is in a range of generally 0.1–50 parts by weight, particularly 0.5–25 parts by weight, and more particularly 1–10 parts by weight per 100 parts by weight of the total amount of the components (A), (B), (C) and (D).

Coating Composition

The coating composition of the present invention can be prepared by mixing the above-mentioned individual components and stirring them so as to obtain a uniform coating composition. For example, the individual components are mixed and then stirred by the use of a stirrer such as a dissolver, with heating as necessary to, for example, about 50° C. until a uniform composition is obtained, for example, for about 10 minutes.

The ultraviolet-curing coating composition for cans of the present invention has ultraviolet-curability, and can form a cured film by being coated on a metal plate, a resin film-laminated metal plate, or a metal can formed by molding of any of these metal plates and then irradiated with ultraviolet rays. The former metal plate includes plates of tinplate, aluminium, tin-free steel, iron, zinc, copper, zinc-plated steel, steel plated with an alloy of zinc and other metal, or the like, which can be molded into a metal can. These metal plates may have been subjected to a chemical treatment such as zinc phosphate treatment or chromate treatment. The resin film-laminated metal plate includes those obtained by laminating, on the former metal plate, a film of a resin such as polyester resin, such as polyethylene terephthalate, polyolefin resin, such as polyethylene or polypropylene, polyamide resin, epoxy resin, polyvinyl chloride or the like. The thickness of the present coating composition applied can be appropriately determined depending upon the application but can be in a range of generally about 2–20 $\mu$m, preferably about 2–8 $\mu$m in terms of dried film thickness.

The ultraviolet-curing coating composition for cans of the present invention can be applied by a coating method such as roll coating, spray coating, brush coating, bar coating, roller coating, silk screen printing or the like. The resulting coating film is subjected to heating or the like for solvent removal when the composition contains a solvent, and then is irradiated with ultraviolet rays for curing. The condition for irradiation can be appropriately varied depending upon the kind of coating composition used, the thickness of film formed, etc. The appropriate wavelength of the ultraviolet rays applied is generally in a range of 200–600 nm. An UV source having a wavelength of high sensitivity can appropriately be selected depending upon the kind of cation-polymerization initiator etc.

The ultraviolet source includes, for example, a high pressure mercury lamp, an ultrahigh pressure mercury lamp, a xenon lamp, a carbon arc, a metal halide lamp and a sunlight. The appropriate UV amount 35 applied is in a range of generally 10–1,000 mJ/cm$^2$, particularly 50–500 mJ/cm$^2$.

The coating film may be heated, as necessary, after irradiation with ultraviolet rays. The heating may reduce the amount of unreacted substances in the film and relax strain of film generated by film curing by UV irradiation and molding. The heating may also improve the hardness and adhesivity of film. The above-mentioned heating can be conducted usually at an atmospheric temperature of 150–250° C. for 1–30 minutes.

The ultraviolet-curing coating composition for cans of the present invention described above comprises, as the film-forming resin components, an epoxy compound (A), a compound having an oxetane ring (B), an oxetane compound having a hydroxyl group(s) (C) and a polyoxetane compound or an epoxy-containing oxetane compound (D), can be cured efficiently by cationic polymerization, in the presence of a cationic polymerization initiator, by irradiation with ultraviolet rays at a low exposure without requiring any facility for nitrogen sealing or the like, and can form a coating film which is excellent, even in a thin film state, in film properties necessary for a coating for cans such as processability, adhesivity, hardness, hardness in hot water etc., and also excellent in film appearance such as levelling etc. Therefore the coating composition of the present invention is particularly suitable for a coating for outer surface of a can.

The present invention is hereinafter described more specifically by way of Examples. In the following, parts and % are by weight.

EXAMPLE 1

40 parts of 3,4-epoxycyclohexylmethyl 3,4-epoxycyclohexanecarboxylate (indicated as Compound A-1 in Table 1), 20 parts of the compound represented by the following formula

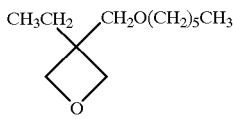

(indicated as Compound B-1 in Table 1), 20 parts of 3-ethyl-3-hydroxymethyloxetane (indicated as Compound C-1 in Table 1), 20 parts of the compound represented by the following formula

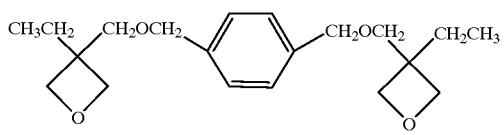

(indicated as Compound D-1 in Table 1), 6 parts of Cyracure UVI-6990 (a product of Union Carbide Corporation, U.S.A.; a photocationic polymerization initiator having $PF_6^-$), 0.5 parts of the fatty acid ester wax a obtained by reacting 1 mole of decaglycerol ether which is the polyglycerol of polymerization grade 10 (having 12 hydroxyl groups in the molecule) and 10 moles of lauric acid, and 0.2 parts of Paint-Add M (a product of Dow Corning Corporation; a silicone wax) are compounded and stirred at 50° C. for 20 minutes to obtain an ultraviolet-curing coating composition for cans.

Examples 2–8 and Comparative Examples 1–5

Operations were conducted in the same manner as in Example 1 except that the compounding recipes shown in the following Table 1 were used, to obtain various kinds of ultraviolet-curing coating composition for cans.

Each note in Table 1 shows the following meaning:

(*1) Compound A-2: a compound having 2 alicyclic epoxy groups in the molecule, represented by the following formula:

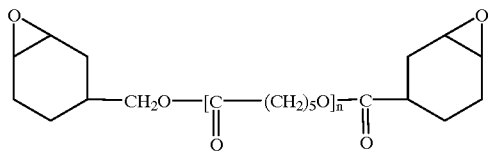

(wherein n shows an average of 1)

(*2) Compound B-2: an oxetane compound represented by the following formula:

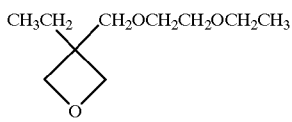

(*3) Compound C-2: a hydroxyl group-containing oxetane compound represented by the following formula:

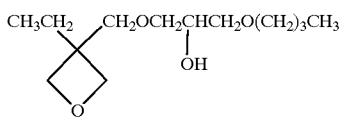

(*4) Compound D-2: an epoxy group-containing oxetane compound represented by the following formula:

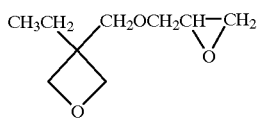

(*5) Copolymer-1: a copolymer obtained by the following Production Process 1.

Production Process 1

In a flask equipped with a stirrer and a cooler were placed 500 parts of toluene and heated to 95° C. while stirring. Then keeping this temperature, a previously mixed and dissolved mixture of 125 parts of glycidyl methacrylate, 375 parts of styrene and 50 parts of 2,2'-azobisisobutyronitrile was added drop by drop in 4 hours. After polymerization, toluene was eliminated by distillation under reduced pressure to obtain Copolymer-1. The obtained Copolymer-1 has a number-average molecular weight of about 3,000, glycidyl group concentration of 1.8 equivalents/kg and glass transition temperature (Tg) of 85° C.

Preparation of Coated Plates for Testing

Each of the coating compositions obtained in the above-mentioned Examples and Comparative Examples was coated on a PET steel plate obtained by heat-and-pressure laminating a homo PET (polyethylene terephthalate) sheet of 12 μm in thickness on a tin-free steel plate of 0.20 mm in thickness, so as to give a coating film thickness of 5 μm in terms of dry film thickness. Each of the coated compositions was irradiated with ultraviolet rays by the use of a metal halide lamp (160 W/cm) from a distance of 10 cm so that the UV amount applied became 150 mJ/cm², whereby each coated film was cured to obtain each coated plate for testing. Each coated plate for testing was tested by the following test methods. All the tests, except for hardness in hot water, were conducted at 20° C.

Test Methods

Pencil hardness: Pencil scratch was conducted on the film of a coated plate for testing, according to JIS K-5400 8.4.2 (1990). Evaluation was made by the breakage of paint film.

Impact resistance (DuPont method): In accordance with JIS K-5400 8.3.2 (1990), an impact molding was applied to the reverse side of the coated film surface of a coated plate for testing, by the use of a DuPont impact tester under the conditions of diameter of impact point=⅜ inches, falling weight=500 g and falling height=50 cm. The molded portion was observed by a microscope and evaluated according to the following standards:

⊚: Neither cracking nor film peeling is observed.
○: Slight cracking is seen but no film peeling is observed.
Δ: Considerable cracking is seen but no film peeling is observed.
×: Film peeling is observed.

Adhesivity: 100 squares of 1.5 mm×1.5 mm were formed on the coated side of a coated plate for testing, in accordance with JIS K-5400 8.5.2 (1900) Cross-cutting and taping method. On these squares was adhered an adhesive cellophane tape; the tape was peeled quickly; and the condition of the squares was evaluated according to the following standards:

⊚: No film peeling is observed.
○: Film was removed slightly at the square periphery.
Δ: Film was removed slightly at the square periphery and other place(s)/
×: Considerable film peeling is observed.

Hardness in hot water: After heating the coated plate for testing at 200° C. for a minute and dipping it in hot water at 80° C. for 10 minutes, the pencil hardness was measured in hot water at 80° C. Evaluation was made by the breakage of paint film in JIS K-5400 8.4.2 (1990).

Furthermore, a test for levelling property of each coating composition obtained by aforementioned Examples and Comparative Examples by the following method.

Levelling Property: Each of the coating compositions was coated on a PET steel plate by roller coat method (natural coating), so as to give a coating film thickness of 5 μm in terms of dry film thickness. Appearance of the film surface was evaluated visually, when the coated film was cured by irradiation with ultraviolet rays under the condition that the time between the coating and the irradiation with ultraviolet rays was 0.5 seconds. The evaluation was conducted according to the following standards:

⊚: No roller mark is observed on the coated surface. Excellent levelling property.
○: Slight roller marks are observed on the coated surface. Good levelling property.
Δ: Considerable roller marks are observed on the coated surface. Considerably inferior levelling property.
×: Remarkable roller marks are observed on the coated surface. Markedly inferior levelling property.

TABLE 1

| | | Example | | | | | | | | Comparative Example | | | | |
|---|---|---|---|---|---|---|---|---|---|---|---|---|---|---|
| | | 1 | 2 | 3 | 4 | 5 | 6 | 7 | 8 | 1 | 2 | 3 | 4 | 5 |
| Component (A) | Compound A-1 | 40 | 40 | 30 | 40 | 20 | 60 | 25 | 40 | 60 | 60 | 60 | 92 | 5 |
| | Compound A-2 (*1) | | | | | 20 | | | | | | | | |
| Component (B) | Compound B-1 | 20 | | 20 | 20 | 20 | 5 | 20 | 20 | | 20 | 20 | 4 | 20 |
| | Compound B-2 (*2) | | 20 | | | | | | | | | | | |
| Component (C) | Compound C-1 | 20 | 20 | | 20 | 20 | 25 | 5 | 20 | 20 | | 20 | 4 | 30 |
| | Compound C-2 (*3) | | | 30 | | | | | | | | | | |
| Component (D) | Compound D-1 | 20 | 20 | 20 | | 20 | 10 | 50 | 20 | 20 | 20 | | | 45 |
| | Compound D-2 (*4) | | | | 20 | | | | | | | | | |
| Copolymer-1 (*5) | | | | | | | | | | | | | 10 | |
| Cyracure UVI-6990 | | 6 | 6 | 6 | 6 | 6 | 6 | 6 | 6 | 6 | 6 | 6 | 6 | 6 |
| Fatty acid ester wax a | | 0.5 | 0.5 | 0.5 | 0.5 | 0.5 | 0.5 | 0.5 | 0.5 | 0.5 | 0.5 | 0.5 | 0.5 | 0.5 |
| Paint-Add M | | 0.2 | 0.2 | 0.2 | 0.2 | 0.2 | 0.2 | 0.2 | 0.2 | 0.2 | 0.2 | 0.2 | 0.2 | 0.2 |
| Test results | Pencil hardness | F | H | H | H | F | H | 2H | H | H | HB | 2B | B | HB |
| | Impact resistance | ○ | ○ | ○ | ○ | ⊚ | ○ | ○ | ⊚ | ○ | ○ | Δ | × | ○ |
| | Adhesivity | ⊚ | ⊚ | ○ | ⊚ | ⊚ | ○ | ⊚ | ⊚ | Δ | Δ | ⊚ | ○ | × |
| | Hardness in hot water | F | F | F | F | HB | F | F | H | F | B | 4B | 3B | B |
| | Levelling property | ⊚ | ⊚ | ⊚ | ⊚ | ⊚ | ○ | ⊚ | ○ | Δ | ○ | ⊚ | Δ | ⊚ |

What is claimed is:

1. An ultraviolet-curing coating composition for cans comprising
   (A) 10–85 parts by weight of a compound having alicyclic epoxy group(s) in the molecule,
   (B) 5–60 parts by weight of a compound having an oxetane ring represented by the following formula (1)

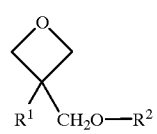

(1)

wherein R¹ represents a hydrogen atom, a fluorine atom, a straight chain, branched chain or cyclic alkyl group of 1–6 carbon atoms, a straight chain, branched chain or cyclic fluoroalkyl group of 1–6 carbon atoms, an allyl group, an aryl group, an aralkyl group, a furyl group or a thienyl group; and $R^2$ represents an alkyl or alkenyl group of 2–12 carbon atoms, an aryl group, an aralkyl group, or an ether group represented by the following formula (2)

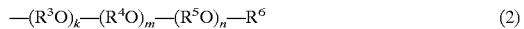                    (2)

wherein $R^3$ represents an ethylene group, $R^4$ represents a propylene group, $R^5$ represents a butylene group, $R^6$ represents an alkyl group of 1–12 carbon atoms, k is an integer of 0–6, m is an integer of 0–6, n is an integer of 0–6, and the sum of k, m and n is an integer of 1–6, (C) 5–60 parts by weight of a compound having an oxetane ring and hydroxyl group in the molecule, (D) 5–60 parts by weight of a compound having either at least two oxetane rings or oxetane ring(s) and epoxy group(s) in the molecule, and (E) 0.01–20 parts by weight of a cation-polymerization initiator, which generates a cation when irradiated with ultraviolet rays, per 100 parts by weight of the total amount of the compounds (A), (B), (C) and (D), each amount of the compounds (A), (B), (C) and (D) being the amount in 100 parts by weight of the total of these 4 components.

2. A coating composition set forth in claim 1, wherein the compound containing alicyclic epoxy group(s) (A) is selected from the group consisting of dicyclopentadiene dioxide, limonene dioxide, di(3,4-epoxycyclohexyl)adipate, (3,4-epoxy-6-methylcyclohexyl)methyl 3,4-epoxy-6-methylcyclohexanecarboxylate, ethylene-1,2-di(3,4-epoxycyclohexanecarboxylic acid)ester, and the compounds represented by the following formulae (3)–(5)

(3)

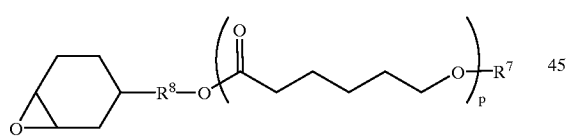

wherein $R^7$ represents a hydrogen atom, an alkyl group of 1–8 carbon atoms which may have epoxy group(s), or an acyl group of 1–12 carbon atoms which may have epoxy group(s); $R^8$ represents an alkylene group of 1–6 carbon atoms; and p represents an integer of 0–15, (4)

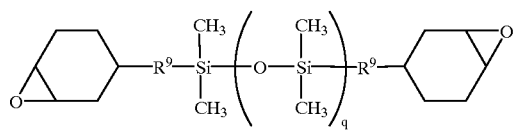

wherein two $R^9$s may be the same or different and each represents an alkylene group of 1–6 carbon atoms; and q represents an integer of 0–25,

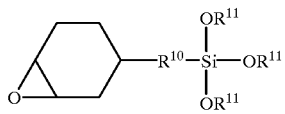                    (5)

wherein $R^{10}$ represents an alkylene group of 1–6 carbon atoms and three $R^{11}$s may be the same or different and each represents an alkyl group of 1–4 carbon atoms.

3. A coating composition set forth in claim 1, wherein the compound containing alicyclic epoxy group(s) (A) is selected from the group consisting of 3,4-epoxycyclohexylmethyl 3,4-epoxycyclohexanecarboxylate, 3,4-epoxycyclohexylmethyl alcohol, 3,4-epoxycyclohexylethyltrimethoxysilane and compounds represented by the following formulae:

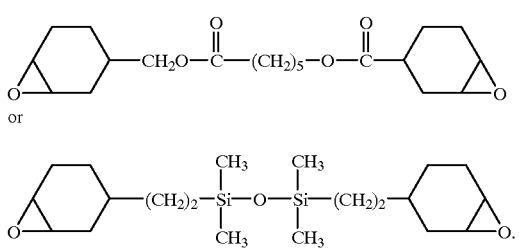

4. A coating composition set forth in claim 1, wherein the compound containing an oxetane ring (B) is the compound of the formula (1), wherein $R^1$ represents an ethyl group.

5. A coating composition set forth in claim 1, wherein the compound containing an oxetane ring (B) is the compound of the formula (1), wherein $R^2$ represents a butyl, hexyl or phenyl group.

6. A coating composition set forth in claim 1, wherein the compound (C) is a compound represented by the following formula (6)

(6)

wherein $R^1$ represents a hydrogen atom, a fluorine atom, a straight chain, branched chain or cyclic alkyl group of 1–6 carbon atoms, a straight chain, branched chain or cyclic fluoroalkyl group of 1–6 carbon atoms, an allyl group, an aryl group, an aralkyl group, a furyl group or a thienyl group; and $R^{12}$ represents a hydrogen atom or an organic group having a hydroxyl group.

7. A coating composition set forth in claim 1, wherein the compound (C) is selected from the group consisting of 3-methyl-3-hydroxymethyloxetane, 3-ethyl-3-hydroxymethyloxetane, 3-ethyl-3-(2'-hydroxyethyl)oxymethyloxetane, 3-ethyl-3-(2'-hydroxy-3'-phenoxypropyl)oxymethyloxetane and 3-ethyl-3-(2'-hydroxy-3'-butoxypropyl)oxymethyloxetane.

8. A coating composition set forth in claim 1, wherein the compound (C) is 3-ethyl-3-hydroxymethyloxetane.

9. A coating composition set forth in claim 1, wherein the compound (D) is selected from the group consisting of the compounds represented by the following formulae (7), (15), (16), (17) and (18):

(7)

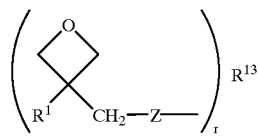

wherein $R^1$ represents a hydrogen atom, a fluorine atom, a straight chain, branched chain or cyclic alkyl group of 1–6 carbon atoms, a straight chain, branched chain or cyclic fluoroalkyl group of 1–6 carbon atoms, an allyl group, an aryl group, an aralkyl group, a furyl group or a thienyl group; and $R^{13}$ represents an organic group having a valency of 2–4, which corresponds to the value of r, Z represents an oxygen atom or a sulphur atom, and r is an integer of 2–4, (15)

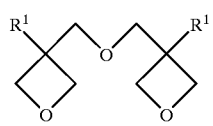

wherein two $R^1$s are the same or different and each has the same meaning as mentioned above, (16)

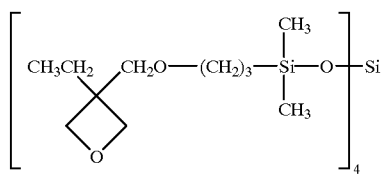

(17)

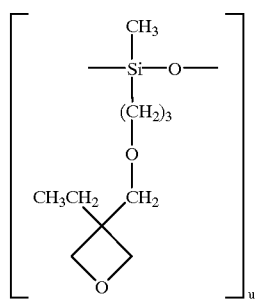

wherein u represents an integer of 25–200, (18)

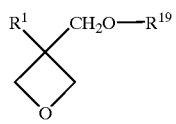

wherein $R^1$ has the same meaning as mentioned above, and $R^{19}$ represents an epoxy-containing group.

10. A coating composition set forth in claim 1, wherein the compound (D) is 3-ethyl-3-glycidyloxymethyloxetane or 1,4-bis[(3-ethyl-3-oxetanylmethoxy)methyl]benzene represented by the following formula:

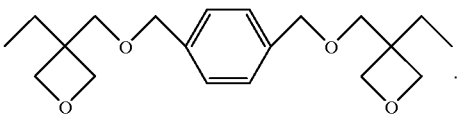

11. A coating composition set forth in claim 1, wherein the cation-polymerization initiator (E) is selected from the group consisting of hexafluoroantimonate salt, pentafluorohydroxyantimonate salt, hexafluorophosphate salt, hexafluoroarsenate salt and tetrakis(pentafluorophenyl) borate salt.

12. A coating composition set forth in claim 1, wherein the cation-polymerization initiator (E) is a compound having a hexafluorophosphate anion ($PF_6^-$).

13. A coating composition set forth in claim 1, which contains 20–70 parts by weight of the compound (A), 10–40 parts by weight of the compound (B), 10–40 parts by weight of the compound (C) and 10–40 parts by weight of the compound (D) in 100 parts by weight of the total of the compounds (A), (B), (C) and (D).

14. A coating composition set forth in claim 1, which contains 0.1–10 parts by weight of the compound (E) per 100 parts by weight of the total of the compounds (A), (B), (C) and (D).

15. A coating composition set forth in claim 1, which further contains 0.01–10 parts by weight of a lubricity-imparting agent per 100 parts by weight of the total of the compounds (A), (B), (C) and (D).

16. A coating composition set forth in claim 15, wherein the lubricity-imparting agent is at least one wax selected from the group consisting of silicone oil waxes and fatty acid ester waxes.

17. A coating composition set forth in claim 1, which further contains 0.1–50 parts by weight of an epoxidized polybutadiene resin per 100 parts by weight of the total of the compounds (A), (B), (C) and (D).

18. A coating composition set forth in claim 1, which further contains 1–50 parts by weight of a copolymer having at least one glycidyl group in the molecule and a glass transition temperature of higher than 30° C. per 100 parts by weight of the total of the compounds (A), (B), (C) and (D).

19. A coating composition set forth in claim 1, which further contains 0.1–50 parts by weight of organic resin fine particles per 100 parts by weight of the total of the compounds (A), (B), (C) and (D).

20. A process for producing a coated metal can, characterized by coating an ultraviolet-curing coating composition for cans set forth in claim 1 on a metal plate, a resin film-laminated metal plate or a metal can obtained by molding of said plate and irradiating the resulting plate or can with ultraviolet rays to cure the coated composition.

21. A metal can coated by the process set forth in claim 20.

* * * * *